(12) United States Patent
Wobig et al.

(10) Patent No.: US 7,324,349 B2
(45) Date of Patent: Jan. 29, 2008

(54) METHOD AND APPARATUS FOR COUPLING A MODULAR COMPONENT TO A CHASSIS

(75) Inventors: Eric C. Wobig, Oxford (GB); Karl Hamand, Round Rock, TX (US); Andrew L. McAnally, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 27 days.

(21) Appl. No.: 11/114,294

(22) Filed: Apr. 26, 2005

(65) Prior Publication Data

US 2006/0238988 A1  Oct. 26, 2006

(51) Int. Cl.
*H05K 5/00* (2006.01)

(52) U.S. Cl. ............... 361/756; 361/727; 361/683; 361/752

(58) Field of Classification Search ........... 361/752, 361/790, 800, 797, 756, 727, 683–686; 439/377; 312/223
See application file for complete search history.

(56) References Cited

U.S. PATENT DOCUMENTS

| | | | | | |
|---|---|---|---|---|---|
| 3,231,785 | A | * | 1/1966 | Calabro | 361/689 |
| 3,476,982 | A | * | 11/1969 | Bell et al. | 361/802 |
| 4,019,099 | A | * | 4/1977 | Calabro | 361/756 |
| 4,022,326 | A | * | 5/1977 | Marconi | 211/41.17 |
| 4,232,356 | A | * | 11/1980 | Saunders et al. | 361/797 |
| 5,098,175 | A | * | 3/1992 | Cooke et al. | 312/334.16 |
| 5,191,514 | A | * | 3/1993 | Kabat et al. | 361/802 |
| 5,340,340 | A | * | 8/1994 | Hastings et al. | 439/64 |
| 6,058,016 | A | * | 5/2000 | Anderson et al. | 361/727 |
| 6,122,174 | A | * | 9/2000 | Livengood et al. | 361/736 |
| 6,313,985 | B1 | | 11/2001 | Chen | |
| 6,373,694 | B1 | * | 4/2002 | Chang | 361/685 |
| 6,600,648 | B2 | | 7/2003 | Curlee | |
| 6,832,927 | B2 | * | 12/2004 | Wilson et al. | 439/347 |
| 6,980,430 | B2 | * | 12/2005 | Su | 361/685 |

* cited by examiner

*Primary Examiner*—Tuan T. Dinh
*Assistant Examiner*—Hung S Bui
(74) *Attorney, Agent, or Firm*—Haynes and Boone, LLP

(57) ABSTRACT

A modular component coupling apparatus includes a chassis and a plurality of guide members mounted in the chassis which define a component channel, the plurality of guide members each including a first end and a second end, the second end including a component securing member adjacent the component channel. A modular component may be coupled to the chassis by engaging the component rear securing member such that vibrations in the modular component are reduced relative to a conventional coupling apparatus.

16 Claims, 14 Drawing Sheets

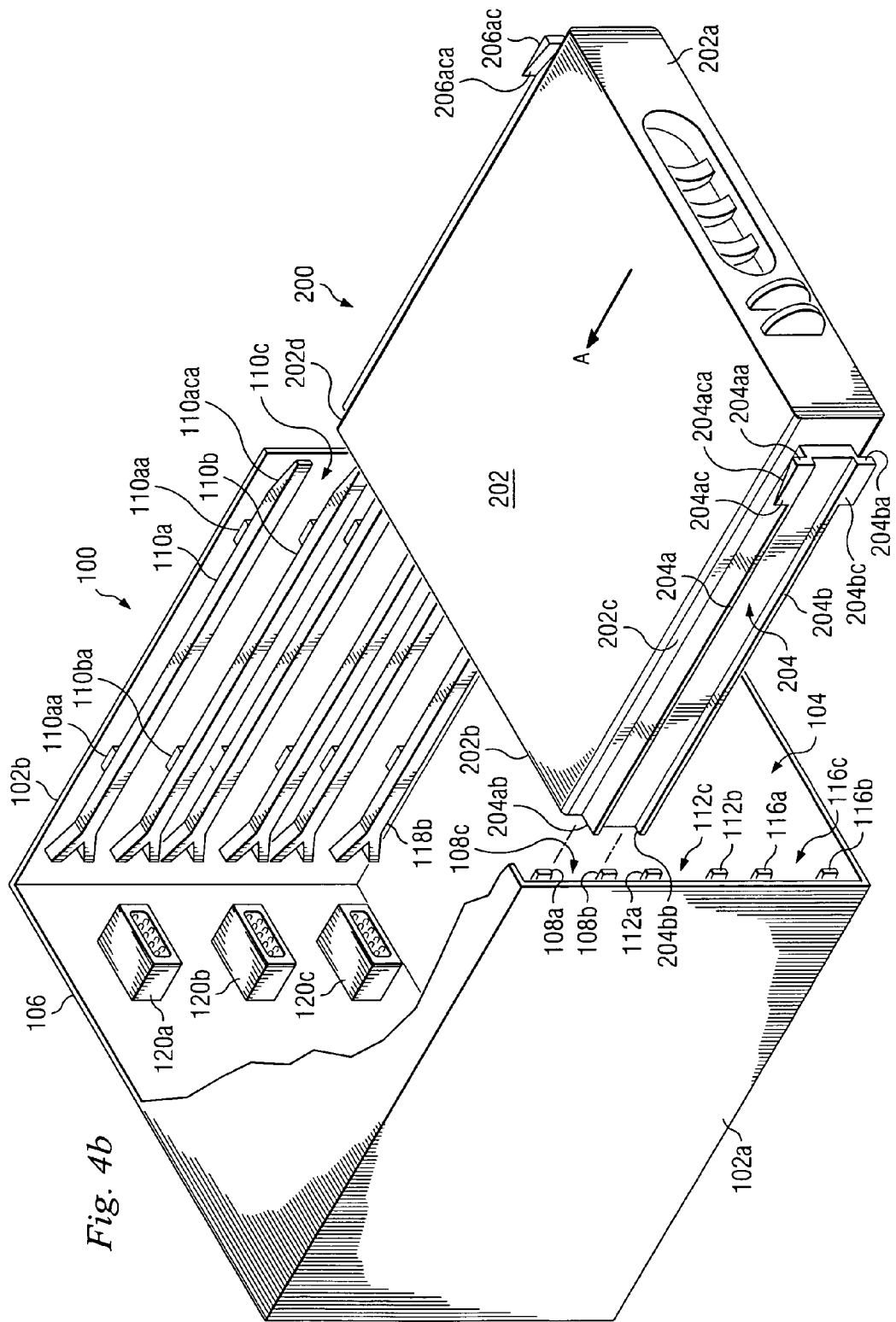

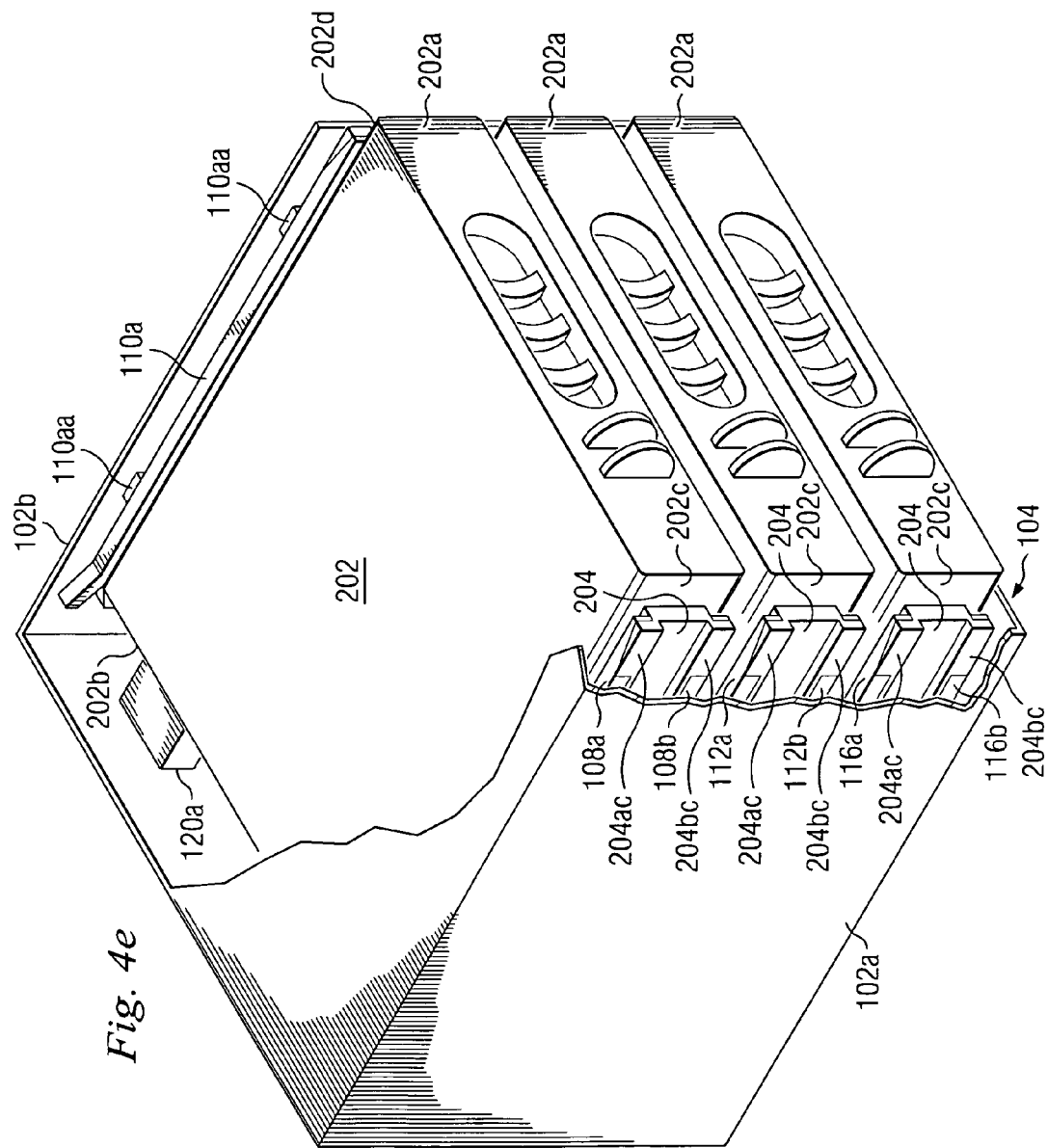

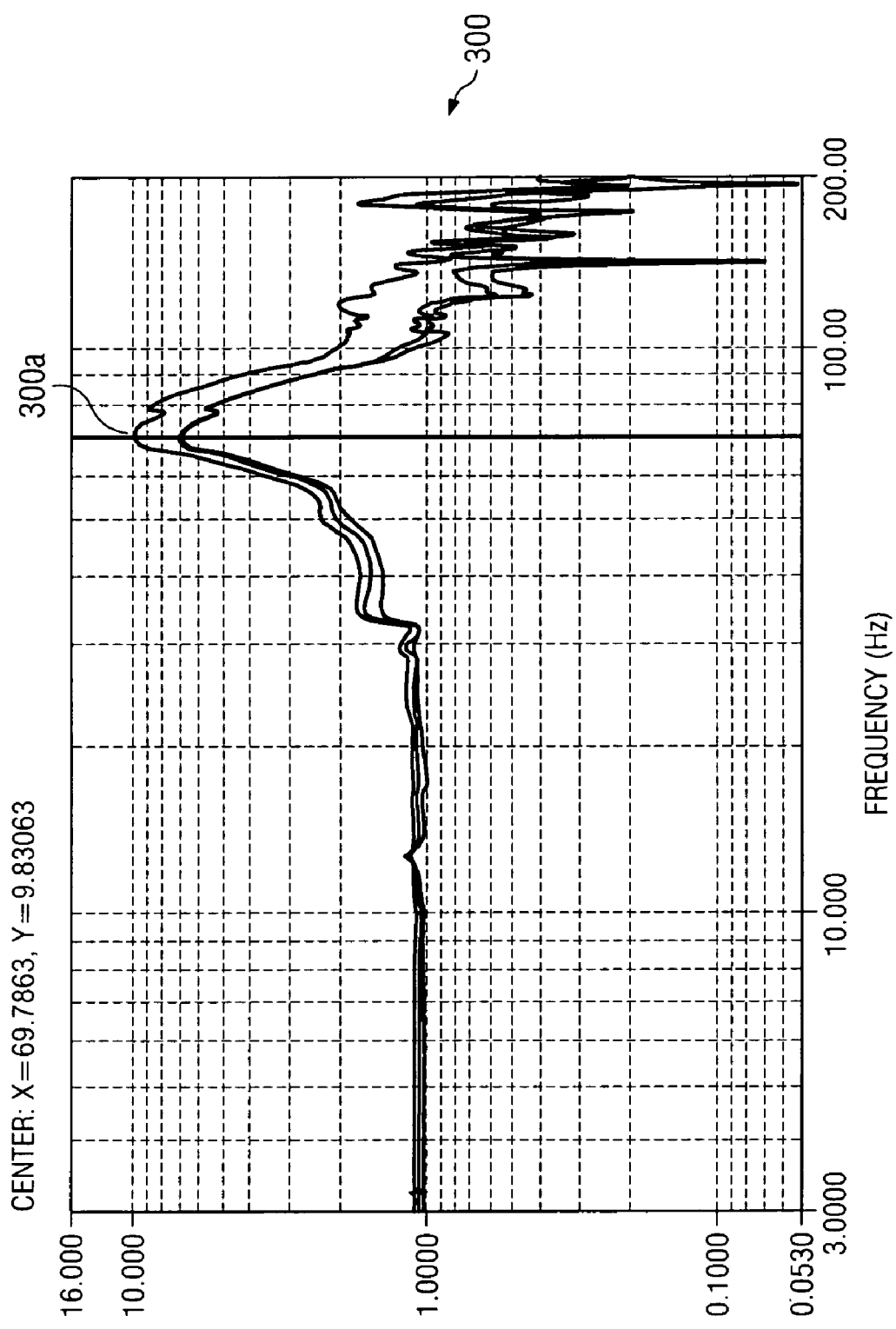

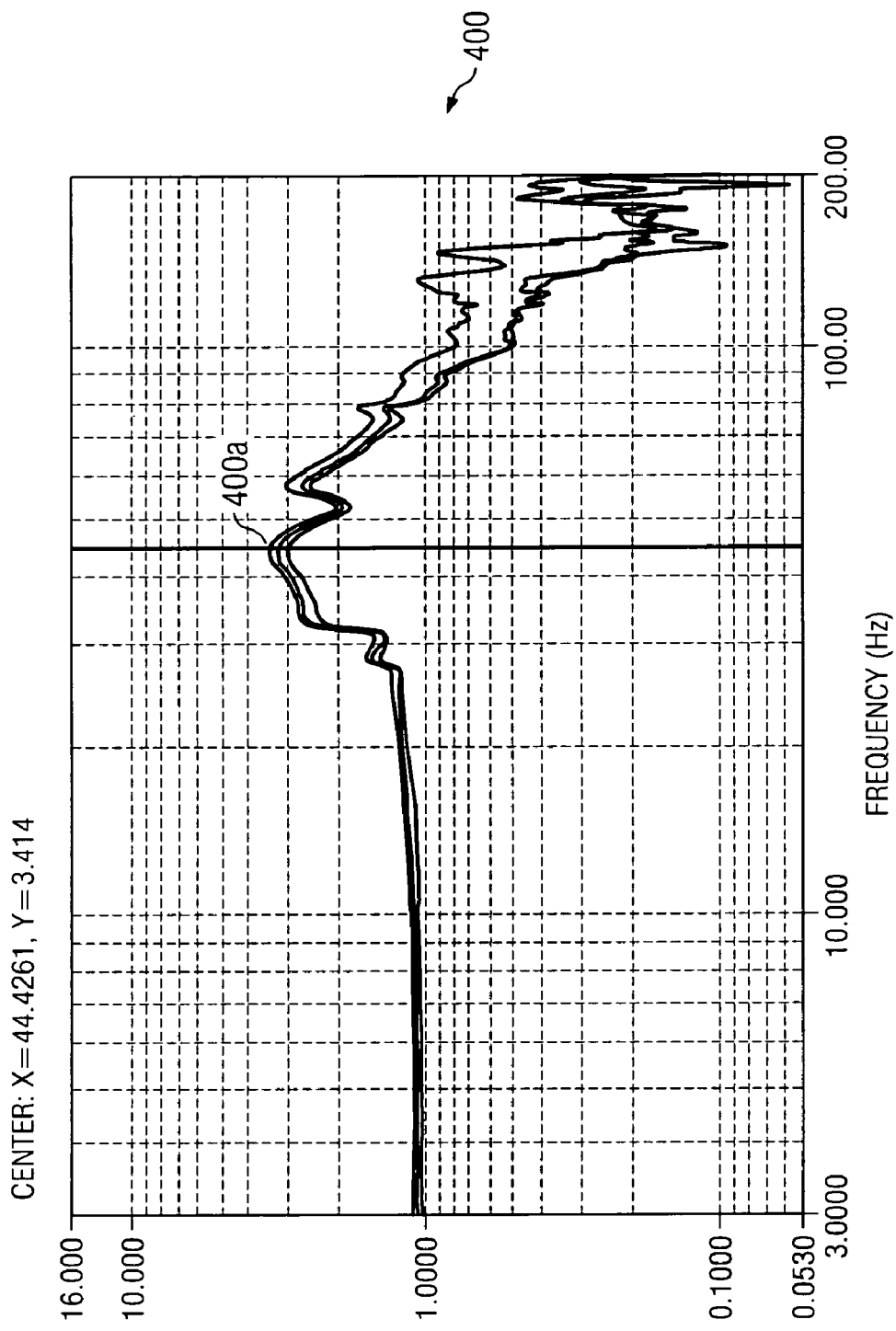

METHOD AND APPARATUS FOR COUPLING A MODULAR COMPONENT TO A CHASSIS

BACKGROUND

The present disclosure relates generally to information handling systems, and more particularly to a method and apparatus for coupling a modular component to an information handling system chassis.

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Many conventional information handling systems accept a variety of modular components which couple to the information handling system chassis and are used by the information handling system. These modular components can be sensitive to vibrations, which raises an issue with respect to the coupling of the modular components to the information handling system chassis.

Typical modular components such as, for example, hard disk drives, are designed to sustain a certain level of vibration input. Such vibration input can come from the information handling system itself such as, for example, from fans or other components in the information handling system, or from sources outside the information handling system. The modular component should be able to couple to the information handling system chassis such that the modular component does not exceed the vibration input level it is designed for, as vibration of the modular component above such levels can reduce the transfer rates of the hard disk drive and/or reduce the life of a hard disk drive.

Conventional methods for coupling modular components to the information handling system chassis include using an apparatus to secure the front of the modular component in place while utilizing the modular components electrical connection to the information handling system chassis to secure the rear of the modular component. With some modular components, these conventional methods fail to satisfy the shock and vibration requirements for the modular component.

Accordingly, it would be desirable to provide a method and apparatus for coupling a modular component to a chassis absent the disadvantages found in the prior methods discussed above.

SUMMARY

According to one embodiment, a modular component coupling apparatus is provided that includes a chassis and a plurality of guide members mounted in the chassis which define a component channel, the plurality of guide members each including a first end and a second end, the second end including a component securing member adjacent the component channel.

A principal advantage of this embodiment is that a modular component may be coupled to the chassis by engaging the component securing members on the second ends of the guide members such that vibrations in the modular component are reduced relative to a conventional coupling apparatus.

BRIEF DESCRIPTION OF THE DRAWINGS

FIG. 2b is a cut-away perspective view illustrating an embodiment of the chassis of FIG. 2a.

FIG. 2c is a perspective view illustrating an embodiment of a plurality of guide members used with in the chassis of FIG. 2a.

FIG. 3a is a perspective view illustrating an embodiment of a modular component used with the chassis of FIG. 2a.

FIG. 3b is a perspective view illustrating an embodiment of the modular component of FIG. 3a.

FIG. 4b is a perspective view illustrating an embodiment of the modular component of FIG. 3a being positioned in the chassis of FIG. 2a during the method of FIG. 4a.

FIG. 4c is a perspective view illustrating an embodiment of the modular component of FIG. 3a being positioned in the chassis of FIG. 2b during the method of FIG. 4a.

FIG. 4d is a perspective view illustrating an embodiment of the modular component of FIG. 3a being coupled to the chassis of FIG. 2b during the method of FIG. 4a.

FIG. 4da is a side view illustrating an embodiment of the modular component and the chassis of FIG. 4d.

FIG. 4db is a top view illustrating an embodiment of the modular component and the chassis of FIG. 4d.

FIG. 4e is a perspective view illustrating an embodiment of a plurality of the modular component of FIG. 3a coupled to the chassis of FIG. 2a.

FIG. 5a is a graphical view illustrating an experimental embodiment of the vibration of a modular component in a chassis.

FIG. 5b is a graphical view illustrating an experimental embodiment of the vibration of a modular component in the chassis of FIG. 2a.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

Figure 1:
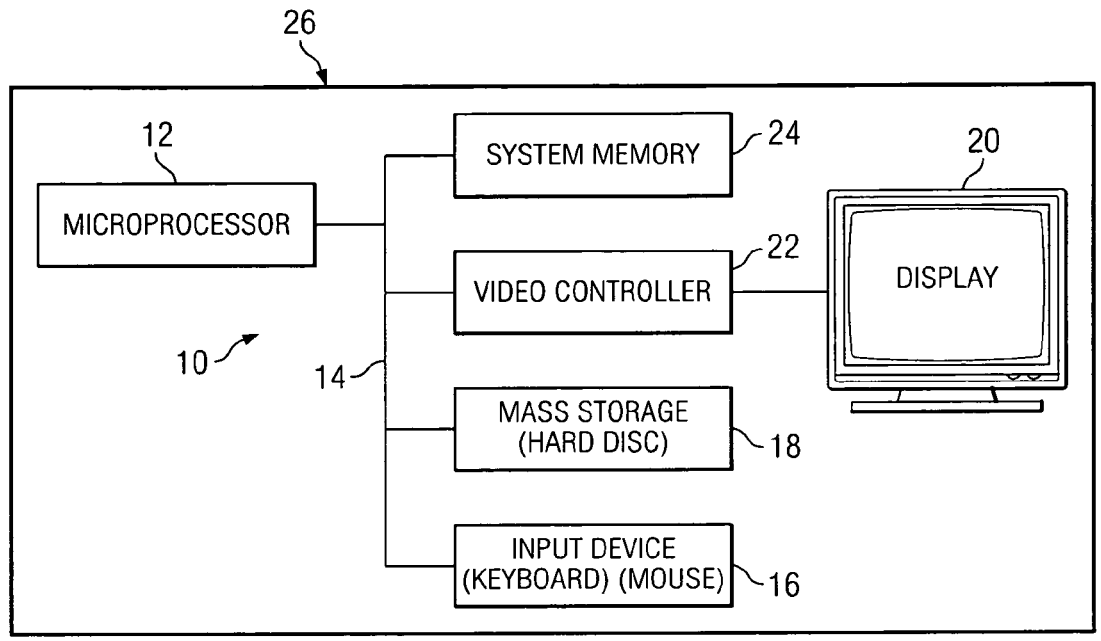
FIG. 1 is a schematic view illustrating an embodiment of an information handling system.
Figure 4A:
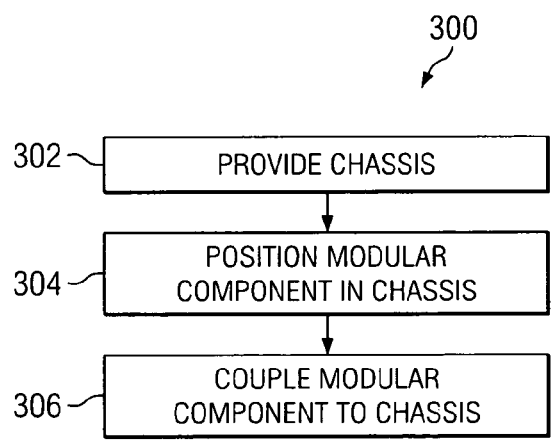
FIG. 4a is a flow chart illustrating an embodiment of a method for coupling a modular component to a chassis.

In one embodiment, information handling system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. In an embodiment, a chassis 26 may house some or all of the components of information handling system 10. It should be understood that other busses and intermediate circuits can be deployed between the components described above and microprocessor 12 to facilitate interconnection between the components and the microprocessor.

Figure 2A:
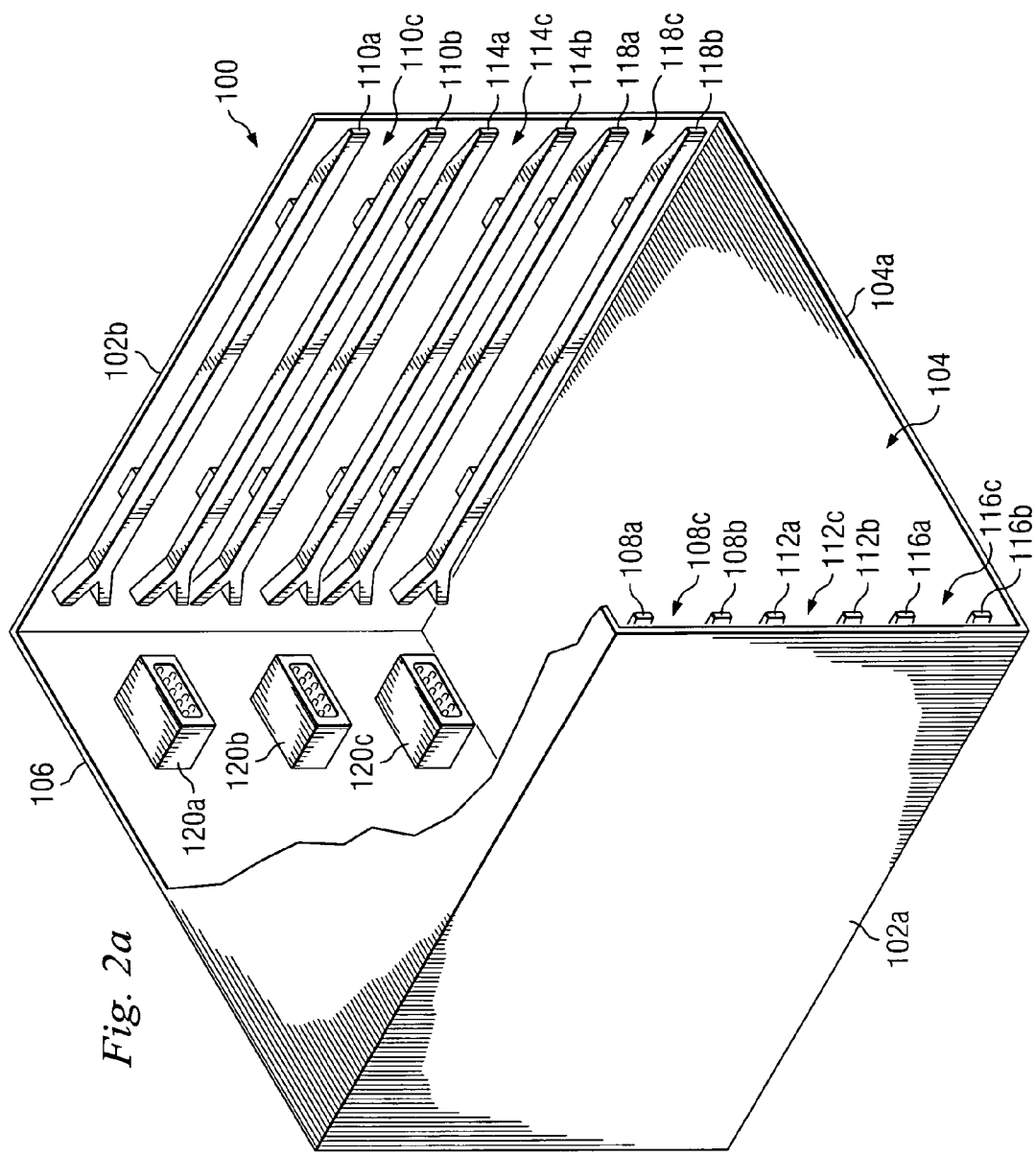
FIG. 2a is a perspective view illustrating an embodiment of a chassis.
Figure 2B:
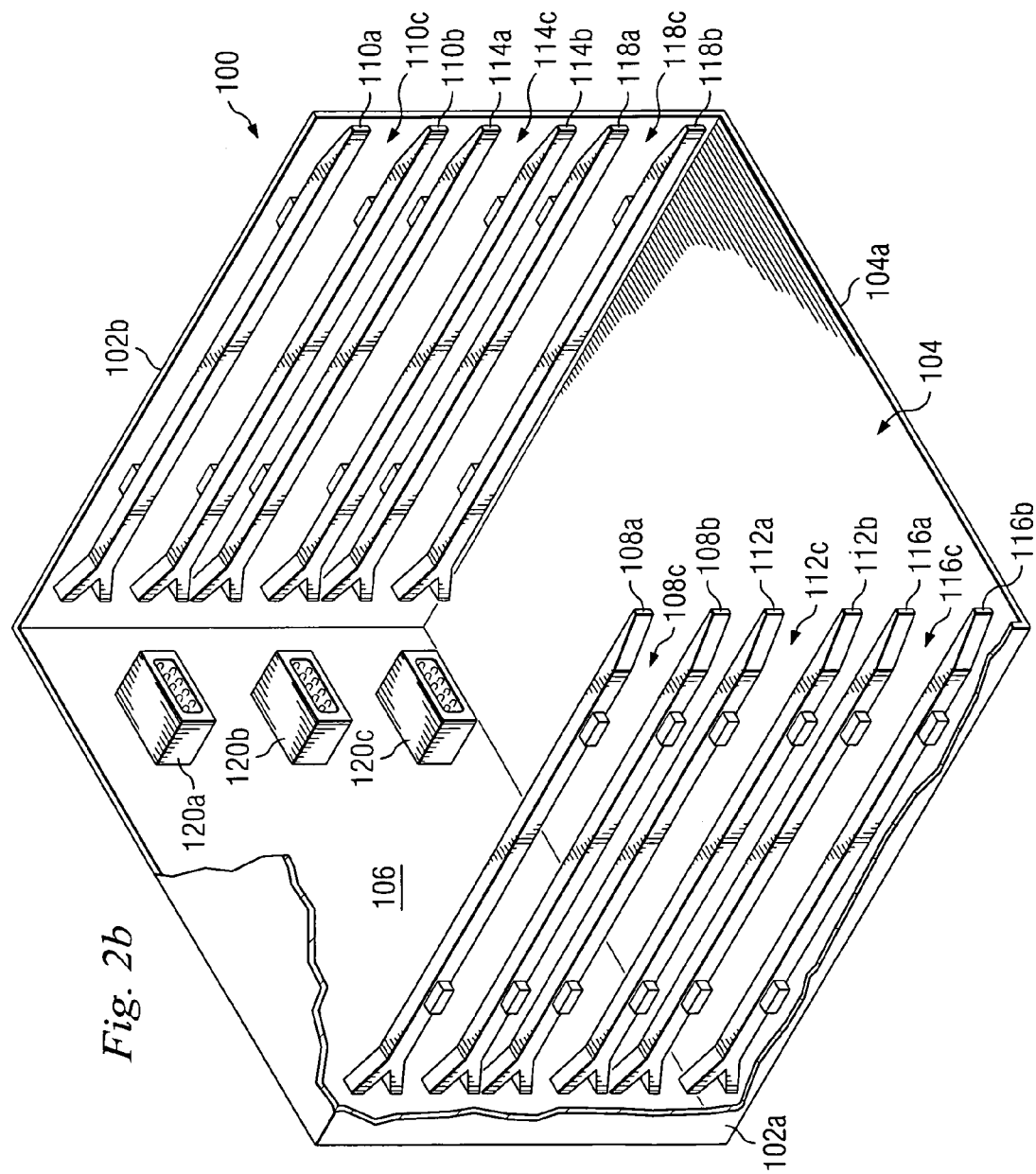
Figure 2C:
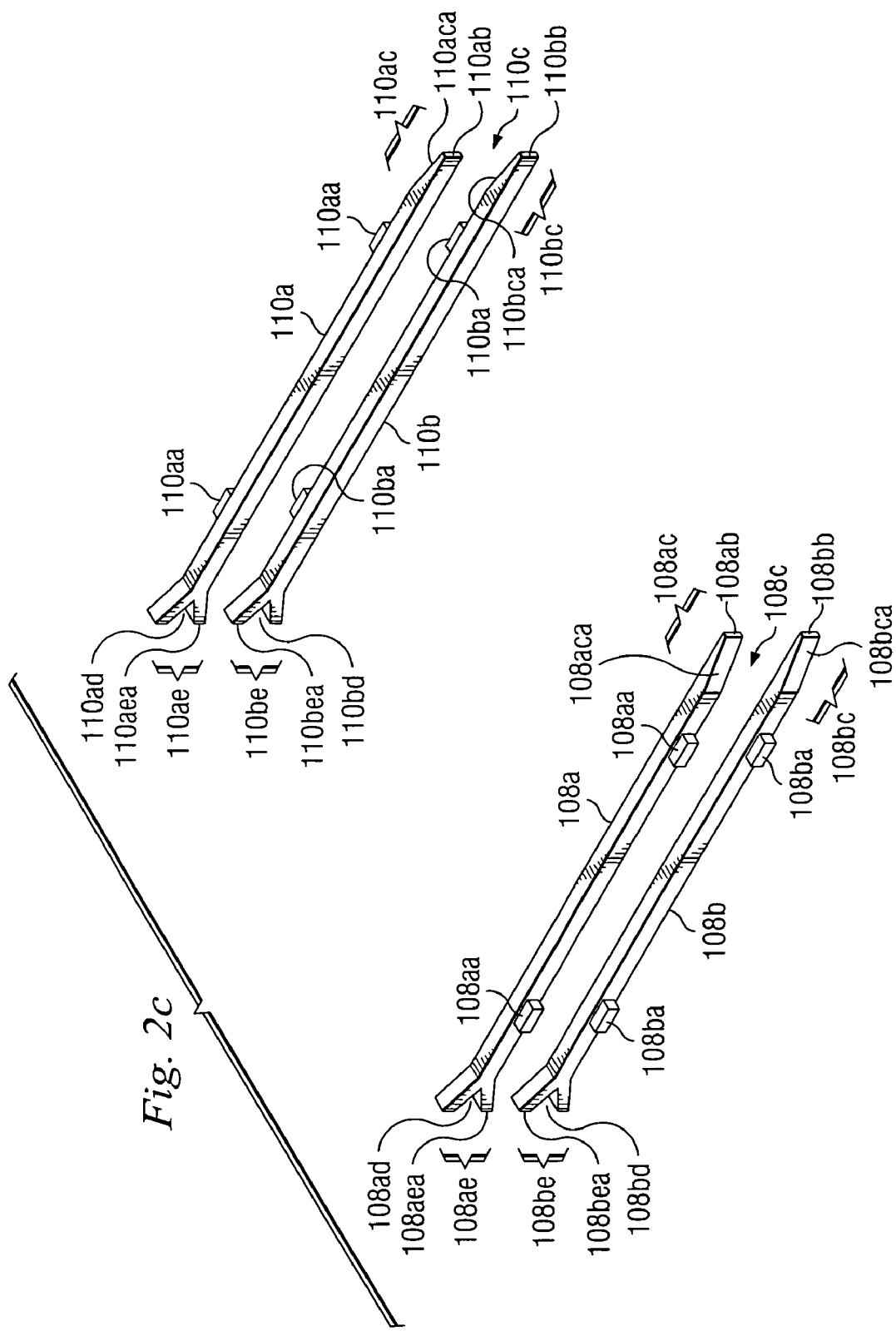

Referring now to FIGS. 2a, 2b, and 2c, a chassis 100 is illustrated which may be, for example, the chassis 26, described above with reference to FIG. 1. Chassis 100 includes a plurality of spaced apart, substantially parallel side walls 102a and 102b which define a chassis enclosure 104 between them that includes an enclosure entrance 104a. A rear wall 106 extends between and couples together the walls 102a and 102b. A plurality of guide members 108a and 108b are mounted to the side wall 102a by a plurality of mounts 108aa and a plurality of mounts 108ba, respectively, in a spaced apart relationship such that the guide members 108a and 108b define a component channel 108c extending between the guide members 108a and 108b and along their lengths. Guide member 108a includes a first end 108ab having component front securing member 108ac which includes a beveled surface 108aca. Guide member 108a also includes a second end 108ad which is located opposite the first end 108ab and includes a component rear securing member 108ae which includes a beam 108aea extending into the component channel 108c. Guide member 108b includes a first end 108bb having component front securing member 108bc which includes a beveled surface 108bca. Guide member 108b also includes a second end 108bd which is located opposite the first end 108bb and includes a component rear securing member 108be which includes a beam 108bea extending into the component channel 108c.

A plurality of guide members 110a and 110b are mounted to the side wall 102b, across the chassis enclosure 104 from and at substantially the same height in the chassis 100 as the guide members 108a and 108b, respectively, by mounts 110aa and 110ba, respectively, in a spaced apart relationship such that the guide members 110a and 110b define a component channel 110c extending between the guide members 110a and 110b and along their lengths. Guide member 110a includes a first end 110ab having component front securing member 110ac which includes a beveled surface 110aca. Guide member 110a also includes a second end 110ad which is located opposite the first end 110ab and includes a component rear securing member 110ae which includes a beam 110aea extending into the component channel 110c. Guide member 110b includes a first end 110bb having component front securing member 110bc which includes a beveled surface 110bca. Guide member 110b also includes a second end 110bd which is located opposite the first end 110bb and includes a component rear securing member 110be which includes a beam 110bea extending into the component channel 110c. In an embodiment, a plurality of guide members 112a, 112b, 114a and 114b are included which are positioned adjacent the guide members 108a, 108b, 110a, and 110b, are substantially similar in design and operation to the guide members 108a, 108b, 110a, and 110b, and which define a plurality of component channels 112c and 114c. In an embodiment, a plurality of guide members 116a, 116b, 118a and 118b are included which are positioned adjacent the guide members 112a, 112b, 114a and 114b, are substantially similar in design and operation to the guide members 108a, 108b, 110a, and 110b, and which define a plurality of component channels 116c and 118c. A plurality of electrical couplers 120a, 120b, and 120c extend from the rear wall 106 and are positioned adjacent the component channels 110c, 114c, and 118c, respectively.

Figure 3A:
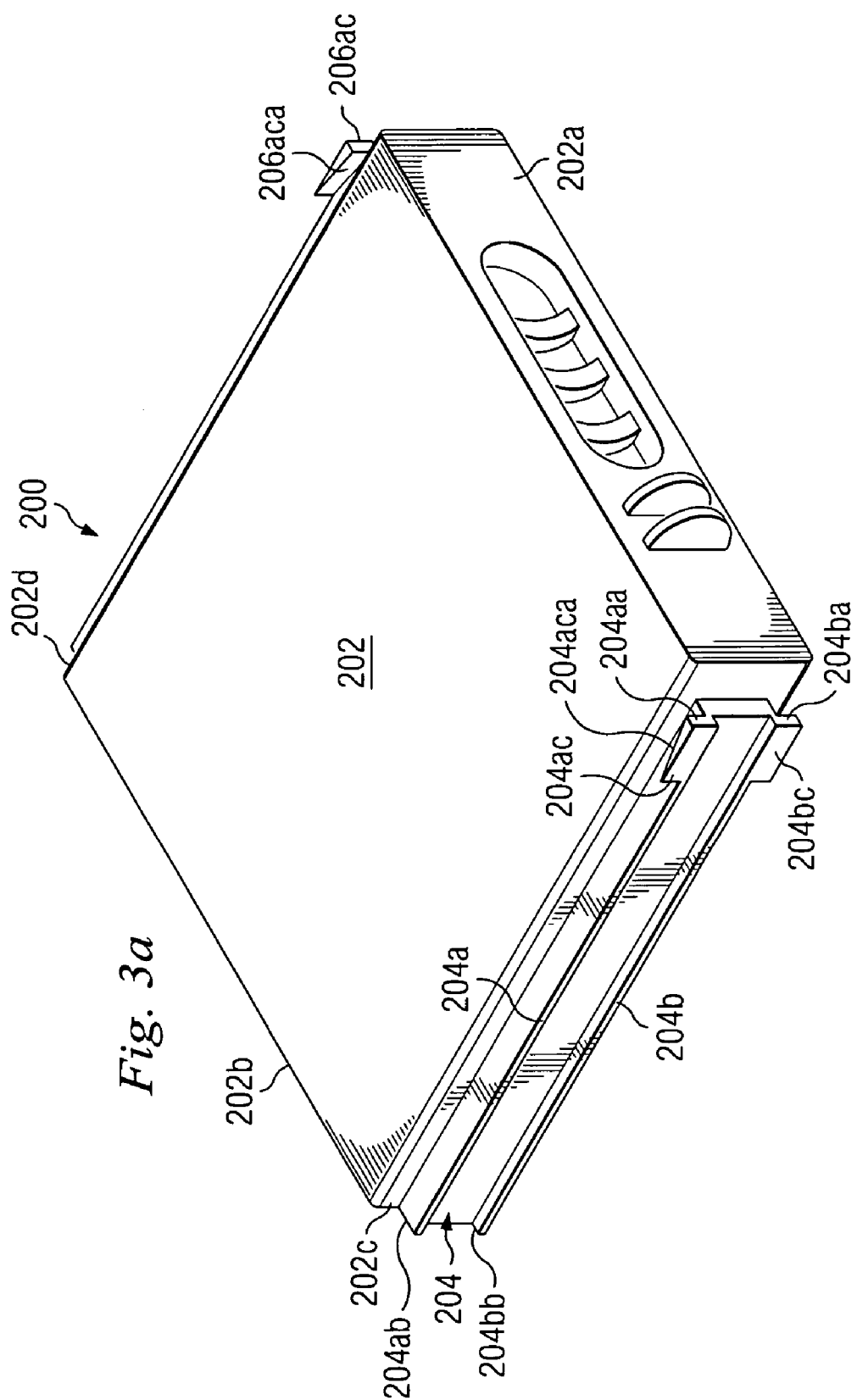
Figure 3B:
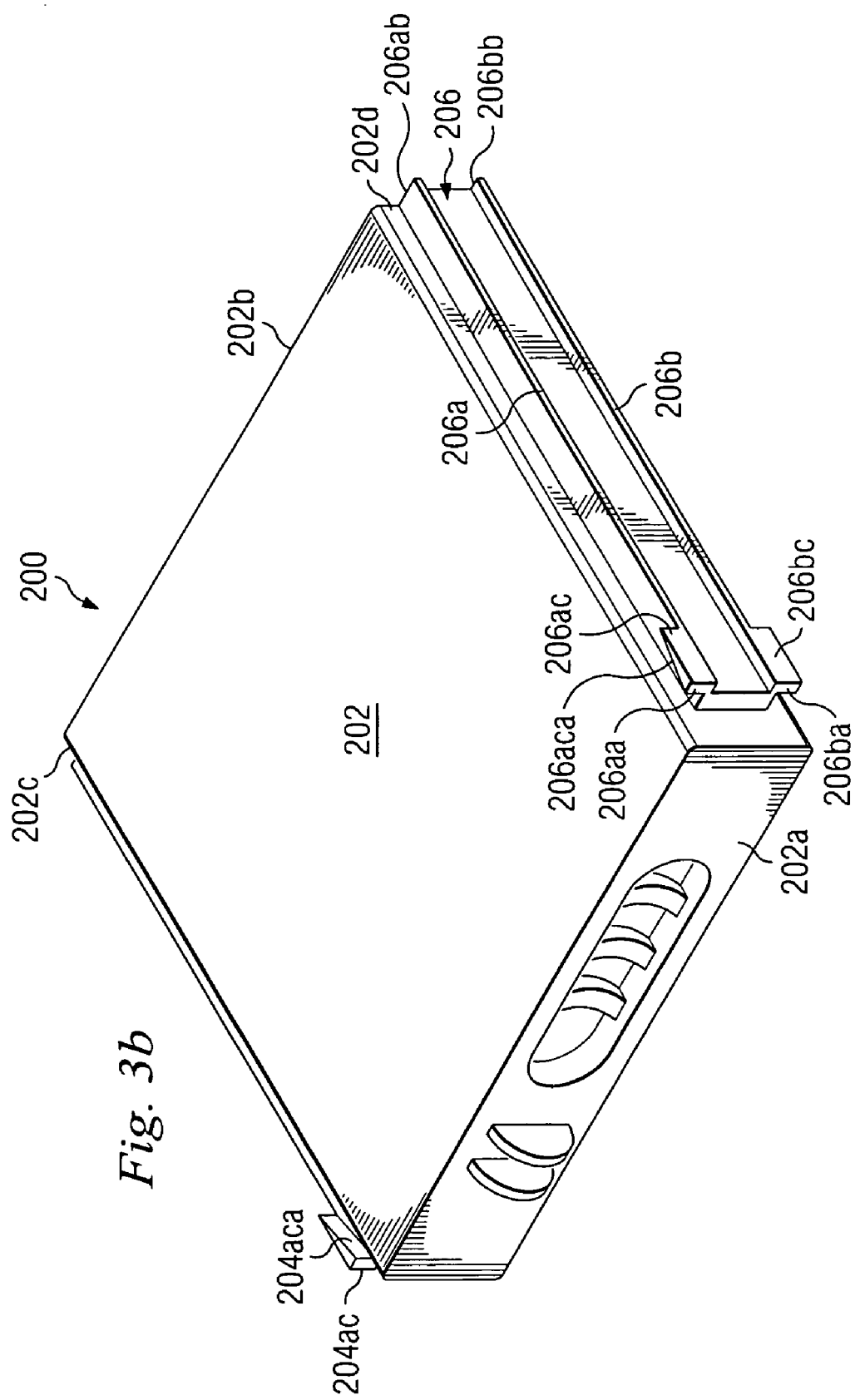
Figure 4C:
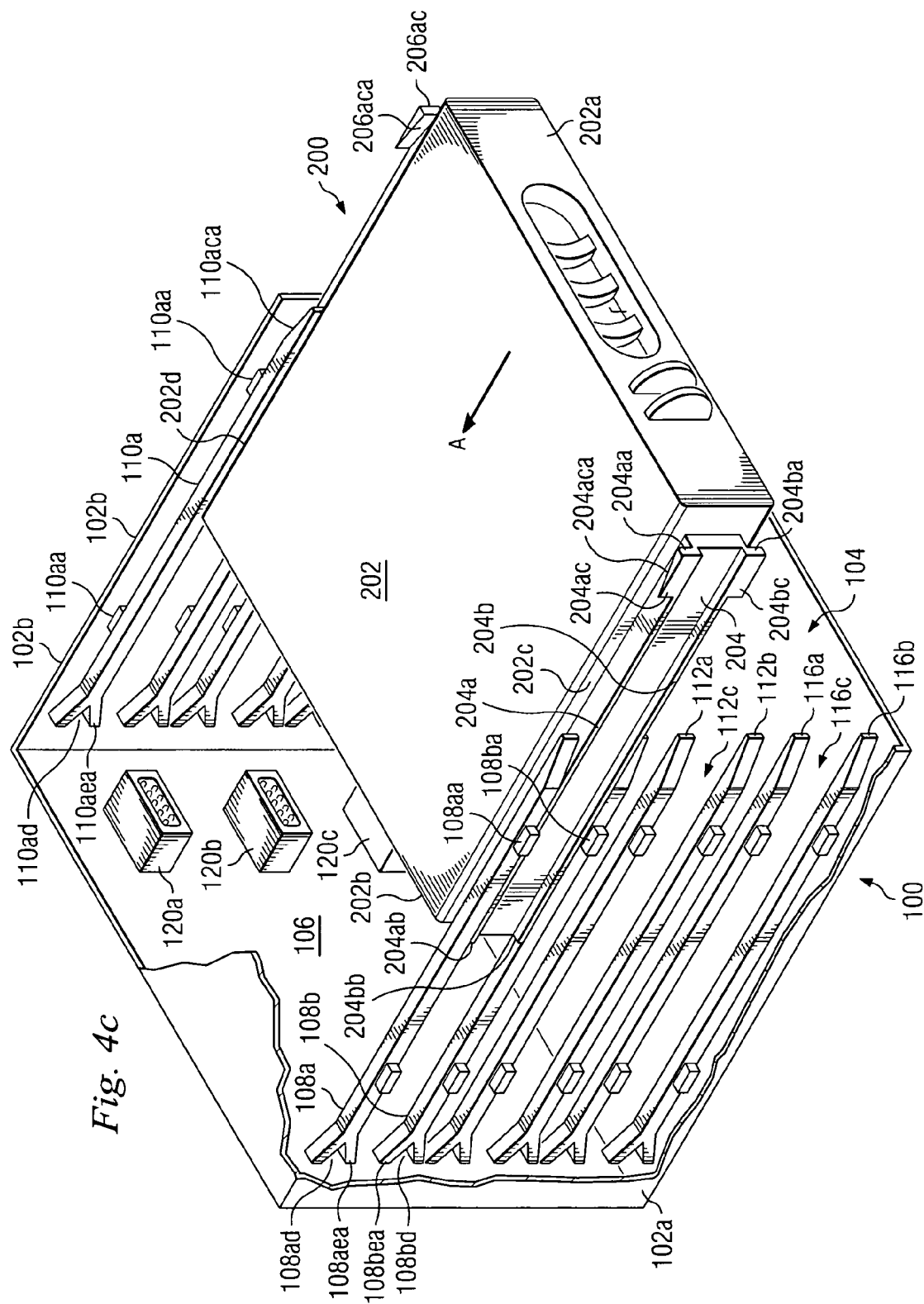
Figure 4D:
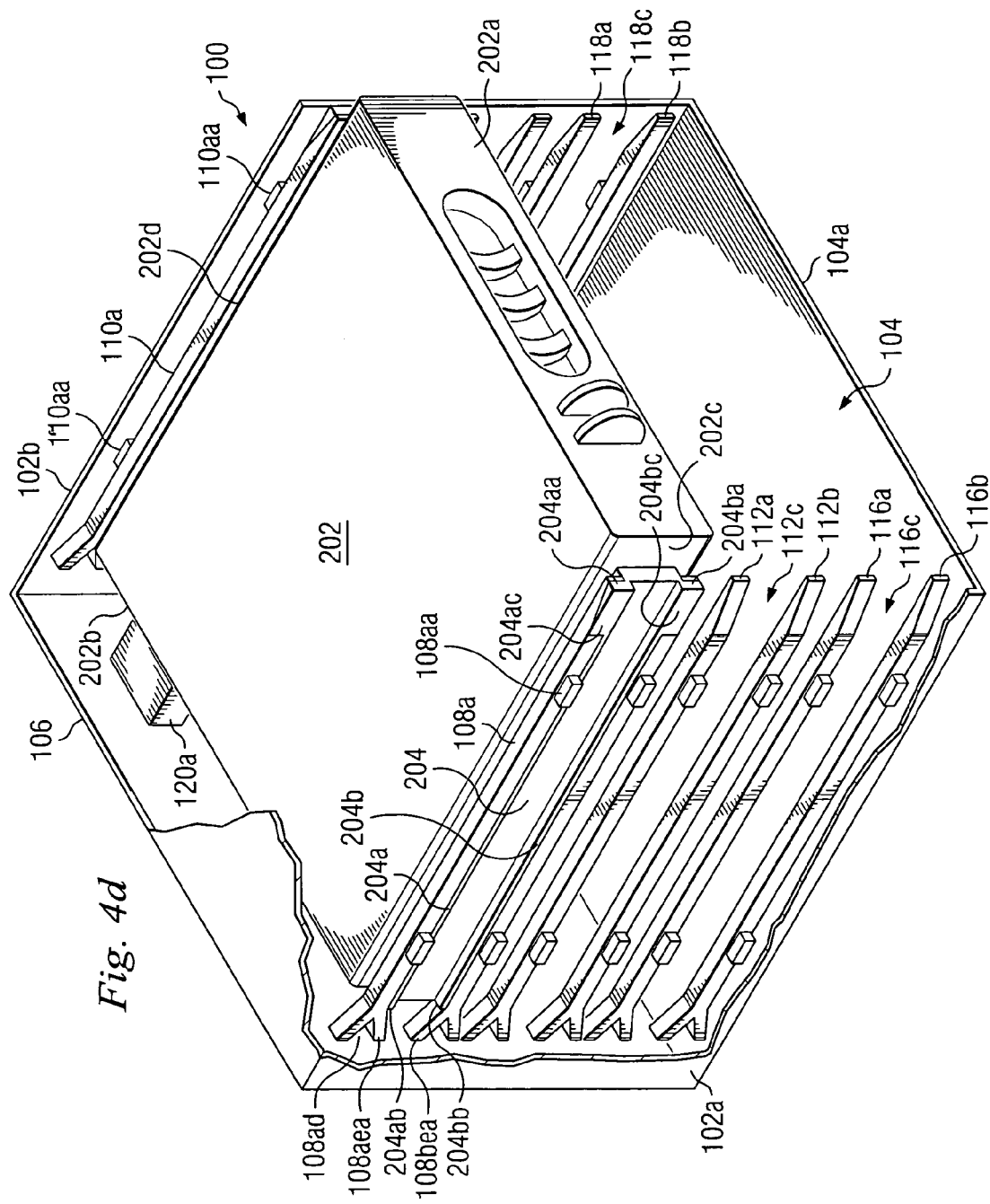
Figure 4D:
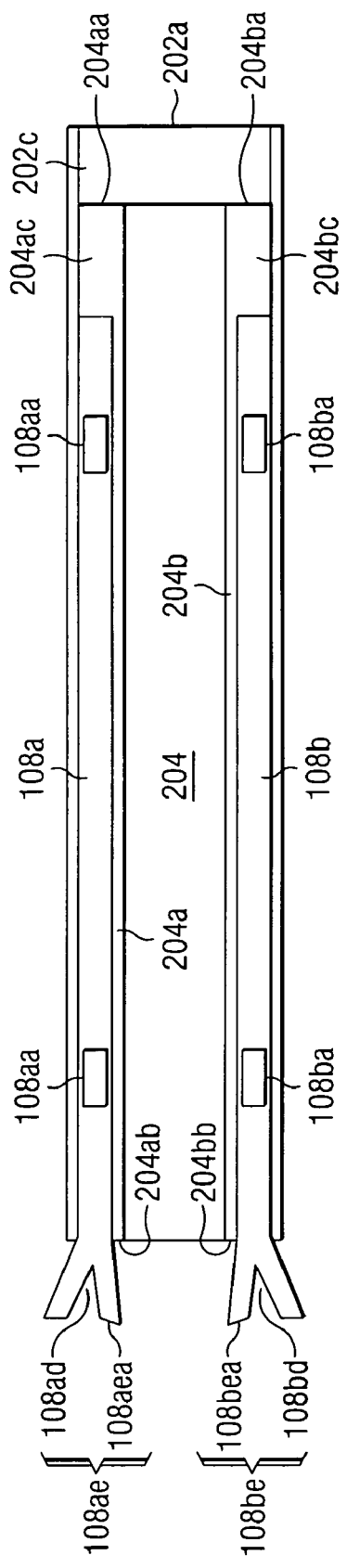
Figure 4D:
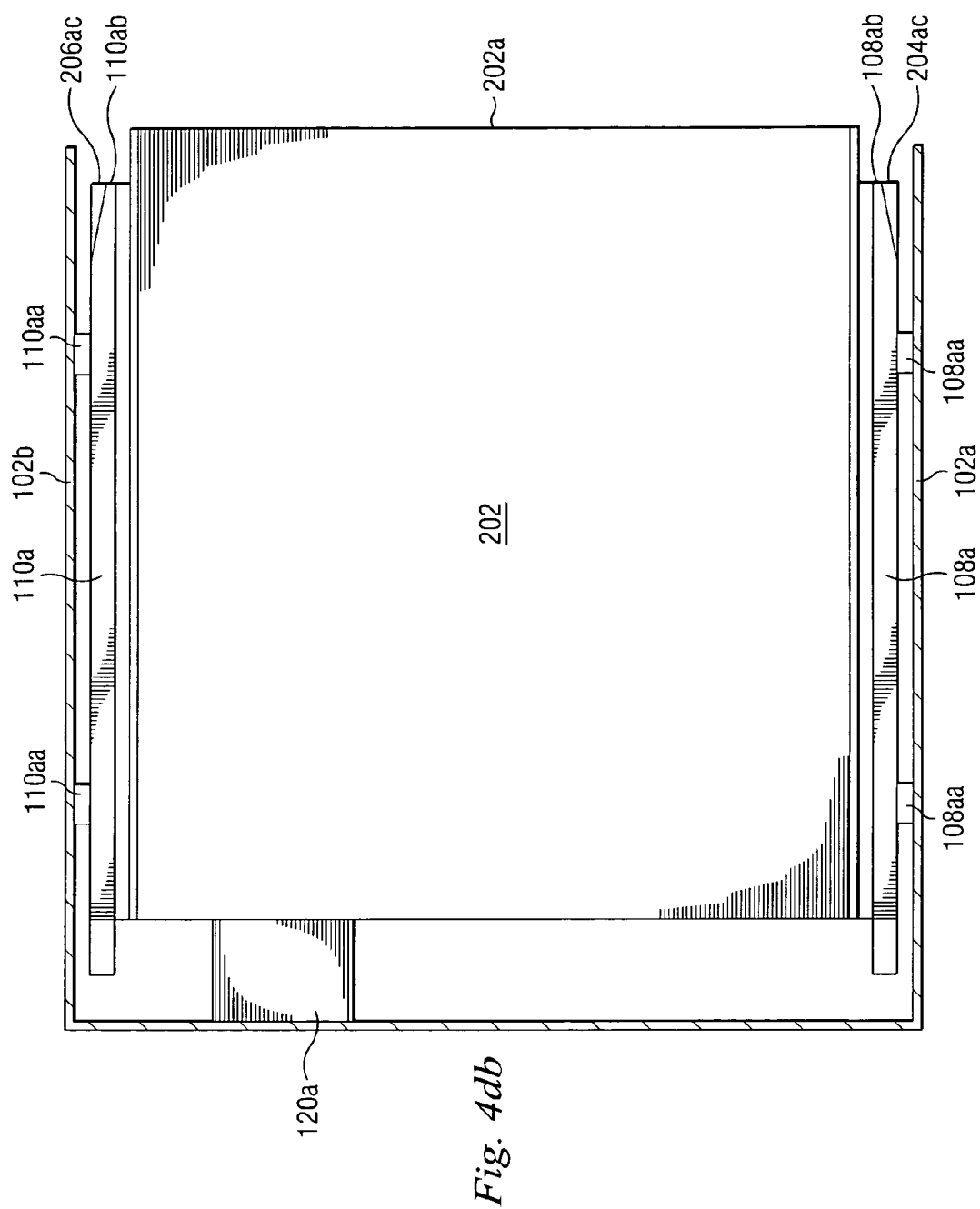

Referring now to FIGS. 3a and 3b, a modular component 200 is illustrated. Modular component 200 includes a base 202 having a front surface 202a, a rear surface 202b located opposite the front surface 202a, and a plurality of opposing side surfaces 202c and 202d extending between the front surface 202a and the rear surface 202b. A coupling member 204 is mounted in the side surface 202c of modular component 200 and includes a plurality of rails 204a and 204b which extend from the coupling member 204 in a substantially parallel and spaced apart relationship. Rail 204a includes a front end 204aa, a rear end 204ab which is located opposite the front end 204aa, and a front coupler 204ac which extends from the rail 204a adjacent the front end 204aa and includes a beveled surface 204aca. Rail 204b includes a front end 204ba, a rear end 204bb which is located opposite the front end 204ba, and a front coupler 204bc which extends from the rail 204b adjacent the front end 204ba and includes a beveled surface (not shown) similar in design and operation to the beveled surface 204aca on rail 204a. A coupling member 206 is mounted in the side surface 202d of modular component 200 and includes a plurality of rails 206a and 206b which extend from the coupling member 206 in a substantially parallel and spaced apart relationship. Rail 206a includes a front end 206aa, a rear end 206ab which is located opposite the front end 206aa, and a front coupler 206ac which extends from the rail 206a adjacent the front end 206aa and includes a beveled surface 206aca. Rail 206b includes a front end 206ba, a rear end 206bb which is located opposite the front end 206ba, and a front coupler 206bc which extends from the rail 206b adjacent the front end 206ba and includes a beveled surface (not shown) similar in design and operation to the beveled surface 206aca on rail 206a. In an embodiment, the modular component 200 may be a hard disk drive. In an embodiment, the modular component 200 may be one of the components of information handling system 10, described above with reference to FIG. 1.

Referring now to FIGS. 2b, 2c, 3a, 3b, 4a, 4b, and 4c, a method 300 for coupling a modular component to a chassis is illustrated. The method 300 begins at step 302 where the chassis 100 is provided. The method 300 then proceeds to step 304 where the modular component 200 is positioned in the chassis 100. The modular component 200 is first positioned adjacent the chassis 100 such that the rear surface 202b on modular component 200 is adjacent the enclosure entrance 104a on chassis 100. Side 202c of modular component 200 is positioned adjacent guide members 108a and 108b and side 202d of modular component 200 is positioned adjacent guide members 110a and 110b such that coupling member 204 is lined up with component channel 108c and coupling member 206 is lined up with component channel 110c. The modular component 200 may then be moved in a direction A, resulting in the coupling members 204 and 206 entering the coupling channels 108c and 110c, respectively, and the modular component 200 being positioned in the chassis 100.

Referring now to FIGS. 2b, 2c, 3a, 3b, 4a, 4c, 4d, 4da, 4db, and 4e, the method 300 proceeds to step 306 where the modular component 200 is coupled to the chassis 100. As modular component 200 continues to move in direction A, the rear ends 204ab and 204bb on rails 204a and 204b, respectively, of coupling member 204 engage the beams 108aea and 108bea of component rear securing members 108ae and 108be, respectively, and the rear ends 206ab and 206bb on rails 206a and 206b, respectively, of coupling member 206 engage the beams 110aea and 110bea of component rear securing members 110ae and 110be, respectively. Engagement of the rear ends 204ab, 204bb, 206ab, and 206bb with the beams 108aea, 108bea, 110aea, and 110bea, respectively, partially deflects the beams 108aea, 108bea, 110aea, and 110bea and results in a secure coupling of the rear of the modular component 200 to the chassis 100. As the rails 204a, 204b, 206a and 206b engage the component rear securing members 108ae, 108be, 110ae, and 110be, respectively, the beveled surface 204aca on front coupler 204ac of rail 204a and the beveled surface (not shown) on front coupler 204bc of rail 204b engage the beveled surfaces 108aca and 108bca, respectively, on component front securing members 108ac and 108bc, respectively. Also, as the rails 204a, 204b, 206a and 206b engage the component rear securing members 108ae, 108be, 110ae, and 110be, respectively, the beveled surface 206aca on front coupler 206ac of rail 206a and the beveled surface (not shown) on front coupler 206bc of rail 206b engage the beveled surfaces 110aca and 110bca, respectively, on component front securing members 110ac and 110bc, respectively. Further movement of modular component 200 in direction A results in the engagement of the electrical coupler 120a with the modular component 200 and also results in an interference fit between component rear securing members 108ae, 108ba, 110ae, 110be and rails 204a, 204b, 206a and 206b, respectively, and in an interference fit between component front securing members 108ac, 108bc, 110ac, and 110bc and the front couplers 204ac, 204bc, 260ac, and 206bc, respectively. In an embodiment, the electrical coupler 120a electrically couples the modular component 200 to other components in the chassis 100 such as, for example, a component of the information handling system 10, described above with reference to FIG. 1. In an embodiment, a plurality of modular components 200 may be coupled to the electrical couplers 120b and 120c by using the guide members 112a, 112b, 114a, 114b, 116a, 116b, 118a, and 118b, as illustrated in FIG. 4e, and using the method 300 in the same manner described above for the modular component 200 using guide members 108a, 108b, 110a, and 110b.

Referring now to FIG. 5a, in an experimental embodiment 300, a modular component similar to the modular component 200, illustrated in FIG. 3a, was coupled to a chassis similar to the chassis 100, illustrated in FIGS. 2a and 2b, but without the component rear securing members 108ae, 108be, 110ae, and 110be. The modular component included equipment for measuring the amount of acceleration the modular component experienced during testing. The chassis with the modular component coupled to it were then vibrated at varying frequencies ranging from 3 hz to 200 hz with an acceleration of 0.25 G, and the acceleration experienced by the modular component was recorded as an acceleration multiplication of that 0.25 G acceleration. The modular component experienced a maximum acceleration multiplication 300a of approximately 9.83 at a frequency of approximately 69.79 hz.

Referring now to FIG. 5b, in an experimental embodiment 400, a modular component similar to the modular component 200, illustrated in FIG. 3a, was coupled to the chassis 100, illustrated in FIGS. 2a and 2b, with the component rear securing members 108ae, 108be, 110ae, and 110be. The modular component included equipment for measuring the amount of acceleration the modular component experienced during testing. The chassis with the modular component coupled to it were then vibrated at varying frequencies ranging from 3 hz to 200 hz with an acceleration of 0.25 G, and the acceleration experienced by the modular component was recorded as an acceleration multiplication of that 0.25 G acceleration. The modular component experienced a maximum acceleration multiplication 400a of approximately 3.41 at a frequency of approximately 44.43 hz. Thus, an apparatus is provided for coupling the modular component 200 to the chassis 100 which reduces the maximum acceleration multiplication in the modular component relative to the acceleration multiplication in the modular component without the apparatus, such as, for example, by a factor of approximately 6, as illustrated in FIGS. 5a and 5b. In an embodiment, the reduction in acceleration multiplication may vary depending on the system, the testing conditions, and a variety of other factors.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A modular component coupling apparatus comprising:
   a chassis; and
   a plurality of guide members mounted in the chassis and defining a component channel located between the guide members, the plurality of guide members each comprising a first end and a second end, the first end of each guide member comprising a first securing member having a beveled surface and the second end of each guide member comprising a second securing member having a beam that extends into the component channel, wherein a rail comprising a coupler having a beveled surface is operable to be positioned in the component channel such that an interference fit is provided between the guide members and the rail in response to the simultaneous engagement of the beams on the second securing members with the rail and the beveled surface of the first securing member with the beveled surface of the coupler.

2. The apparatus of claim 1 wherein the beams on the second securing members of the guide members engage opposing sides of the rail when the rail is located in the component channel and between the component securing members.

3. The apparatus of claim 1 wherein the plurality of guide members include at least four guide members, the at least four guide members including a first pair of spaced apart guide members positioned on a first wall of the chassis and a second pair of spaced apart guide members positioned on a second wall of the chassis.

4. The apparatus of claim 1 wherein the plurality of guide members define a plurality of component channels.

5. The apparatus of claim 1 further comprising:
a modular component mounted to the rail that is positioned in the component channel and engaging the beams on the second securing members of the guide members.

6. The apparatus of claim 5 wherein the modular component includes a hard disk drive.

7. The apparatus of claim 1 wherein the rail comprises a plurality of couplers each comprising a beveled surface.

8. An information handling system comprising:
a chassis;
a microprocessor mounted in the chassis;
a plurality of guide members mounted to the chassis and defining a component channel between the guide members;
a first end on each guide member comprising a first securing member having a beveled surface; and
a second end on each guide member comprising a second securing member having a beam that extends into the component channel, wherein a rail comprising a coupler having a beveled surface is operable to be positioned in the component channel such that an interference fit is provided between the guide members and the rail in response to the simultaneous engagement of the beams on the second securing members with the rail and the beveled surface of the first securing member with the beveled surface of the coupler.

9. The system of claim 8 wherein the plurality of guide members include at least four guide members, the at least four guide members including a first pair of spaced apart guide members positioned on a first wall of the chassis and a second pair of spaced apart guide members positioned on a second wall of the chassis.

10. The system of claim 8 wherein the plurality of guide members define a plurality of component channels.

11. The system of claim 8 further comprising:
a modular component mounted to the rail.

12. The system of claim 11 wherein the modular component includes a hard disk drive.

13. The system of claim 11 further comprising:
an electrical coupler mounted in the chassis, electrically coupled to the microprocessor, and operable to couple to a the modular component when the interference fit is provided between the guide members and the rail.

14. The system of claim 11 wherein the modular component is electrically coupled to the microprocessor with the rail positioned in the component channel.

15. A method for coupling a modular component to a chassis comprising:
providing a chassis comprising a plurality of guide members that are mounted to the chassis, a component channel defined between the guide members, and a first end and a second end on each guide member, each guide member including a first securing member having a beveled surface on the first end and a second securing member having a beam on the second end that extends into the component channel;
positioning a modular component including a rail comprising a coupler having a beveled surface in the component channel; and
coupling the modular component to the chassis by simultaneously engaging the beams on the second securing members with the rail and the beveled surface on the first securing member with the beveled surface on the coupler of the rail to provide an interference fit between the rail the guide members.

16. The method of claim 15 where the coupling comprises electrically coupling the modular component to an information handling system housed in the chassis during the simultaneous engagement of the beams on the second securing members with the rail and the beveled surface on the first securing member with the beveled surface on the coupler.

* * * * *